United States Patent
Liang et al.

(10) Patent No.: US 8,243,403 B2
(45) Date of Patent: Aug. 14, 2012

(54) ELECTROSTATIC DISCHARGE CLAMP CIRCUIT

(75) Inventors: Yung-Chih Liang, Taipei County (TW); Chih-Ting Yeh, Miaoli County (TW); Shih-Hung Chen, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 448 days.

(21) Appl. No.: 12/538,860

(22) Filed: Aug. 10, 2009

(65) Prior Publication Data
US 2010/0296212 A1 Nov. 25, 2010

(30) Foreign Application Priority Data
May 20, 2009 (TW) ................. 98116793 A

(51) Int. Cl.
*H02H 3/20* (2006.01)
*H02H 9/04* (2006.01)
(52) U.S. Cl. .............. 361/56; 361/111; 361/91.1
(58) Field of Classification Search .............. 361/56, 361/111, 91.1; 257/355
See application file for complete search history.

(56) References Cited

U.S. PATENT DOCUMENTS

| | | | |
|---|---|---|---|
| 5,440,162 A * | 8/1995 | Worley et al. | 257/355 |
| 5,946,177 A | 8/1999 | Miller et al. | |
| 6,249,410 B1 * | 6/2001 | Ker et al. | 361/56 |
| 6,510,033 B1 | 1/2003 | Maloney et al. | |
| 6,768,616 B2 * | 7/2004 | Mergens et al. | 361/56 |
| 6,989,979 B1 | 1/2006 | Tong et al. | |
| 7,017,175 B2 | 3/2006 | Alao et al. | |
| 7,027,275 B2 | 4/2006 | Smith | |
| 7,064,942 B2 * | 6/2006 | Ker et al. | 361/56 |
| 7,102,862 B1 | 9/2006 | Lien et al. | |
| 7,196,890 B2 | 3/2007 | Smith | |
| 7,405,915 B2 * | 7/2008 | Choi | 361/56 |
| 2005/0002139 A1 | 1/2005 | Yeh et al. | |
| 2006/0198069 A1 | 9/2006 | Chuan et al. | |
| 2007/0285854 A1 | 12/2007 | Rodgers et al. | |

OTHER PUBLICATIONS

Authored by Gauthier, et al., article titled "Design and characterization of a multi-RC-triggered. MOSFET-based power clamp for on-chip ESD protection," adopted from in Proc. EOS/ESD Symp., 2006, pp. 179-185.
Authored by Gauthier, et al., article titled "A compact, timed-shutoff, MOSFET-based power clamp for on-chip ESD protection," adopted from in Proc. EOS/ESD Symp., 2004.
Authored by Quittard, et al., article titled "ESD Protection for High-Voltage CMOS Technologies ," adopted from in Proc. EOS/ESD Symp., 2006, pp. 77-86.

* cited by examiner

*Primary Examiner* — Rexford Barnie
*Assistant Examiner* — Zeev V Kitov
(74) *Attorney, Agent, or Firm* — Jianq Chyun IP Office

(57) ABSTRACT

An electrostatic discharge (ESD) clamp circuit is provided. The ESD clamp circuit includes a first resistor, a second resistor, a first transistor, a second transistor, and a third transistor. A clamp device of the ESD clamp circuit is implemented by the third transistor. A parasitic capacitor of the third transistor forms a detection scheme along with the second resistor to detect the ESD. The first resistor, the second resistor, the first transistor, and the second transistor form a feedback scheme to control the third transistor for discharging the ESD current.

32 Claims, 16 Drawing Sheets

500

ELECTROSTATIC DISCHARGE CLAMP CIRCUIT

CROSS-REFERENCE TO RELATED APPLICATION

This application claims the priority benefit of Taiwan application serial no. 98116793, filed on May 20, 2009. The entirety of the above-mentioned patent application is hereby incorporated by reference herein and made a part of specification.

BACKGROUND

1. Technical Field

The present disclosure generally relates to a protection circuit, in particular, to a protection circuit for electrostatic discharge.

2. Description of Related Art

With the progress of technology, electronic devices are displacing traditional mechanical devices gradually. Electronic devices are often suffered from electrostatic discharge (ESD). The static electricity accumulated in human body (or machine) may be discharged through the electronic devices because of human body (or machine) contact, whether in manufacturing process or in actual use. Because the voltage generated by the ESD event is much higher than the voltage that the electronic devices can endure, the function of the electronic devices may be damaged, or even permanent damage is caused. Moreover, the electronic devices themselves may also accumulate static electricity, and the static electricity can be discharged while the electronic devices are grounded during assembling, thus resulting in unexpected loss.

Therefore, in order to avoid the devices damages caused by the ESD, the corresponding measures are taken to protect the electronic devices. FIG. 1 and FIG. 2 are conventional ESD clamp circuit diagrams. Referring to FIG. 1, an ESD clamp circuit 100 employs a resistor-capacitor (RC) time-delay-triggered architecture. A resistor $R_1$ and a capacitor $C_1$ form a RC circuit used to detect the ESD. A P-channel metal oxide semiconductor (PMOS) transistor $M_{P1}$ and an N-channel metal oxide semiconductor (NMOS) transistor $M_{N1}$ form an inverter 101 used to control an NMOS transistor $M_{C1}$ which serves as a clamp device. A node $T_3$ is an output terminal of the inverter 101, which is coupled to a drain of the transistor $M_{P1}$ and a drain of the transistor $M_{N1}$. When the ESD occurs at a power rail $V_{DD}$, a voltage across the two ends of the resistor $R_1$ is generated, such that the input terminal of the inverter 101 is at a low potential. At this point, the inverter 101 outputs a high potential, turns on the transistor $M_{C1}$ to form a low-impedance path, and discharge the ESD current to a power rail $V_{SS}$, so as to protect a core circuit 103 on the back-end. During the discharging of the ESD current, the current flowing through the resistor $R_1$ charges the capacitor $C_1$. At this point, the input terminal of the inverter 101 rises to a high potential gradually, while the output terminal of the inverter 101 drops to a low potential gradually. When the charge for the capacitor $C_1$ is finished, the transistor $M_{C1}$ is turned off.

Referring to FIG. 2, the ESD clamp circuit 110 employs a capacitor-coupling-triggered architecture. When the ESD occurs at the power rail $V_{DD}$, the ESD may be coupled to the gate of a transistor $M_{C2}$ through a capacitor $C_2$, and a voltage across the two ends of a resistor $R_2$ is generated, so as to control an NMOS transistor $M_{C2}$ which serves as a clamp device. At this point, the transistor $M_{C2}$ is turned on to form a low-impedance path, so as to discharge the ESD current to the power rail $V_{SS}$. During the discharging of the ESD current, through the discharge of the resistor $R_2$, the gate voltage of the transistor $M_{C2}$ is dropped gradually. Finally, the transistor $M_{C2}$ is turned off because its gate voltage is pulled down to a low potential.

The clamp device can be implemented by a big field effect transistor (BIGFET). Because the BIGFET has a very large channel width, so it can produce a low enough turn-on resistance, thus discharging the ESD current to the power rail $V_{SS}$ rapidly. Referring to FIG. 1 and FIG. 2, in order to discharge the ESD current efficiently, the resistor $R_1$-$R_2$ and the capacitor $C_1$-$C_2$ have to employ a very large resistance value and a capacitance value, so as to enable the transistor $M_{C1}$-$M_{C2}$ to keep sufficient channel turn-on time to discharge the ESD current, that is, extending the time constant of the RC circuit. However, the RC circuit having overly large resistance value and capacitance value may result in the problem that the ESD clamp circuits 100 and 110 are liable to be triggered wrongly when they are suffering from large noises. Meanwhile, a quite large layout area is required when the RC circuit having overly large resistance value and capacitance value is applied in circuit layout.

Relevant examples of employing the RC time-delay-triggered architecture may be obtained with reference to "A Compact, Timed-shutoff, MOSFET-based Power Clamp for On-chip ESD Protection" published in EOS/ESD symp. (2004) by Junjun Li et al, pp. 273-279; U.S. Pat. No. 5,946,177 to James Wesley Miller et al; "Design and Characterization of a Multi-RC-triggered MOSFET-based Power Clamp for On-chip ESD Protection" published in EOS/ESD symp. (2006) by Junjun Li et al, pp. 179-185; and "ESD Protection for High-Voltage CMOS Technologies" published in EOS/ESD symp. (2006) by Olivier Quittard et al, pp. 77-86. Relevant examples of employing the capacitor-coupling-triggered architecture may be obtained with reference to U.S. Pat. No. 7,027,275 B2 to Jeremy C. Smith and U.S. Pat. No. 0,285,854 A1 to Thurman John Rodgers et al. It can be known from the above papers or patents that, in order to extend the time of turning on the clamp device, a manner of increasing the RC time constant of the detection circuit may be utilized. Alternatively, a scheme of making the resistors and capacitors charge and discharge through the control circuit can be utilized, so as to extend the control of the turn-on time of the clamp device channel. However, the manner may increase the risk of being wrongly triggered when the circuit is in a fast power-on, and may occupy a large layout area. In addition, utilizing a control circuit having a feedback scheme to implement the clamp circuit still has the risk of being wrongly triggered due to overly large power noise. Moreover, all of the ESD clamp circuits designed in the above-mentioned manners require additional devices to accomplish the design of the detection circuit, which may also occupy a certain layout area.

SUMMARY

The present disclosure is directed to an electrostatic discharge (ESD) clamp circuit, which utilizes a parasitic capacitor of a clamp device to implement a detection circuit, and extends a turn-on time of the clamp device by a control circuit with a feedback scheme, so as to decrease a circuit layout area.

Consistent with the invention, there is provided an ESD clamp circuit, which includes a first resistor, a second resistor, a first transistor, a second transistor, and a third transistor. A first end of the first resistor is coupled to a first rail, and a second end of the second resistor is coupled to a second rail. A control end of the first transistor is coupled to a first end of the second resistor, a first end of the first transistor is coupled to a second end of the first resistor, and a second end of the first transistor is coupled to the second rail. A control end of the second transistor is coupled to the second end of the first resistor, a first end of the second transistor is coupled to the first rail, and a second end of the second transistor is coupled to the first end of the second resistor. A control end of the third transistor is coupled to the first end of the second resistor, a first end of the third transistor is coupled to the first rail, and a second end of the third transistor is coupled to the second rail.

When an ESD occurs, the first transistor is turned on by utilizing a parasitic capacitor of the third transistor and the second resistor. The current generated after the first transistor is turned on flows through the first resistor, so as to generate a voltage drop to turn on the second transistor. The current generated by turning on the second transistor increases the voltage applied to turn on the first transistor and the third transistor through the second resistor. With such a feedback scheme, the voltage for turning on the third transistor is increased, the third transistor is turned on to discharge the ESD current during the ESD, and the channel turn-on time of the third transistor depends on the length of time that the ESD lasts. Meanwhile, such an ESD clamp circuit requires only a few of devices to implement, and can reduce the circuit layout area.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is under fast power-on.

FIG. 5B and FIG. 5C are partial signal simulation diagrams when the ESD clamp circuit 300 in FIG. 3 is under fast power-on.

FIG. 5D is a partial signal simulation diagram when the ESD clamp circuit 100 in FIG. 1 is under fast power-on.

FIG. 8A is a signal simulation diagram when the power rail $V_{DD}$ in FIG. 6 is under fast power-on.

FIG. 8B and FIG. 8C are partial signal simulation diagrams when the ESD clamp circuit 400 in FIG. 6 is under fast power-on.

DESCRIPTION OF THE EMBODIMENTS

Figure 1:
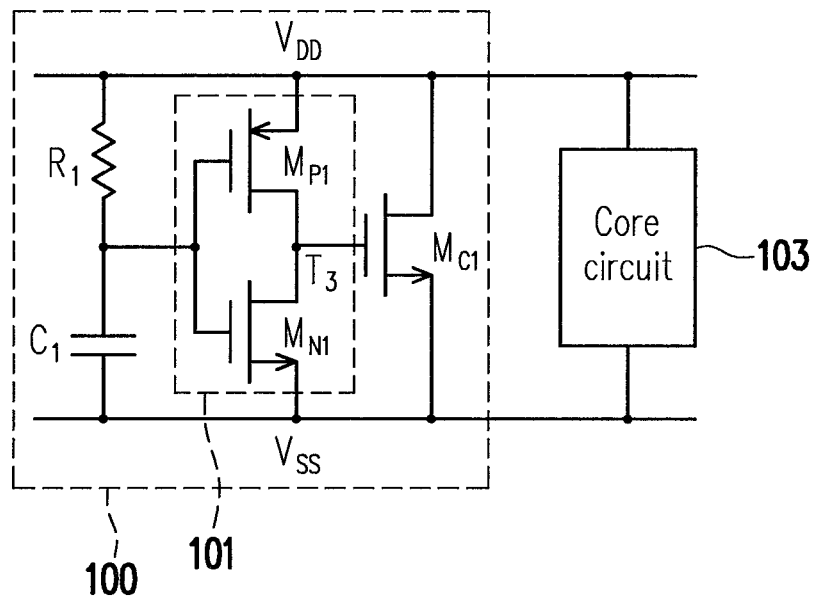
FIG. 1-FIG. 2 are conventional ESD clamp circuit diagrams.
Figure 2:
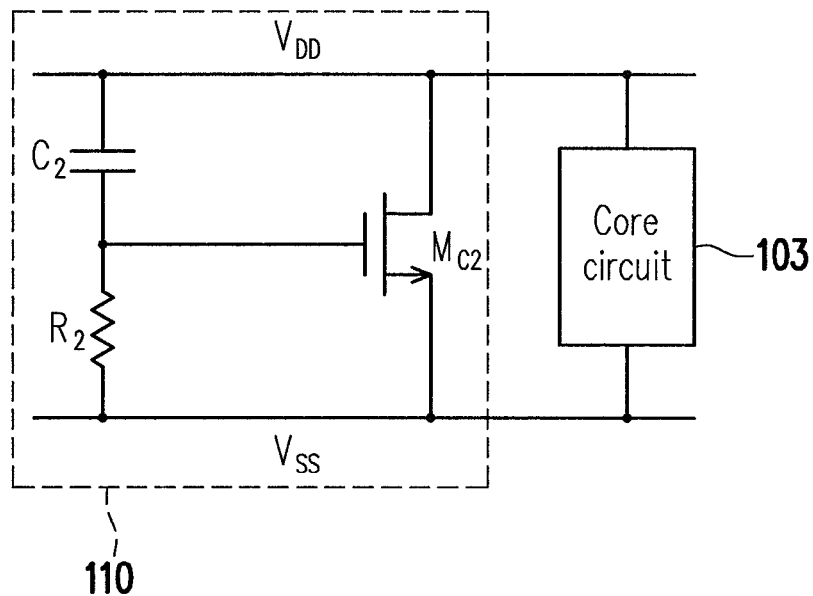

Reference will now be made in detail to these embodiments of the invention, examples of which are illustrated in the accompanying drawings. Wherever possible, the same reference numbers are used in the drawings and the description to refer to the same or like parts.

Figure 3:
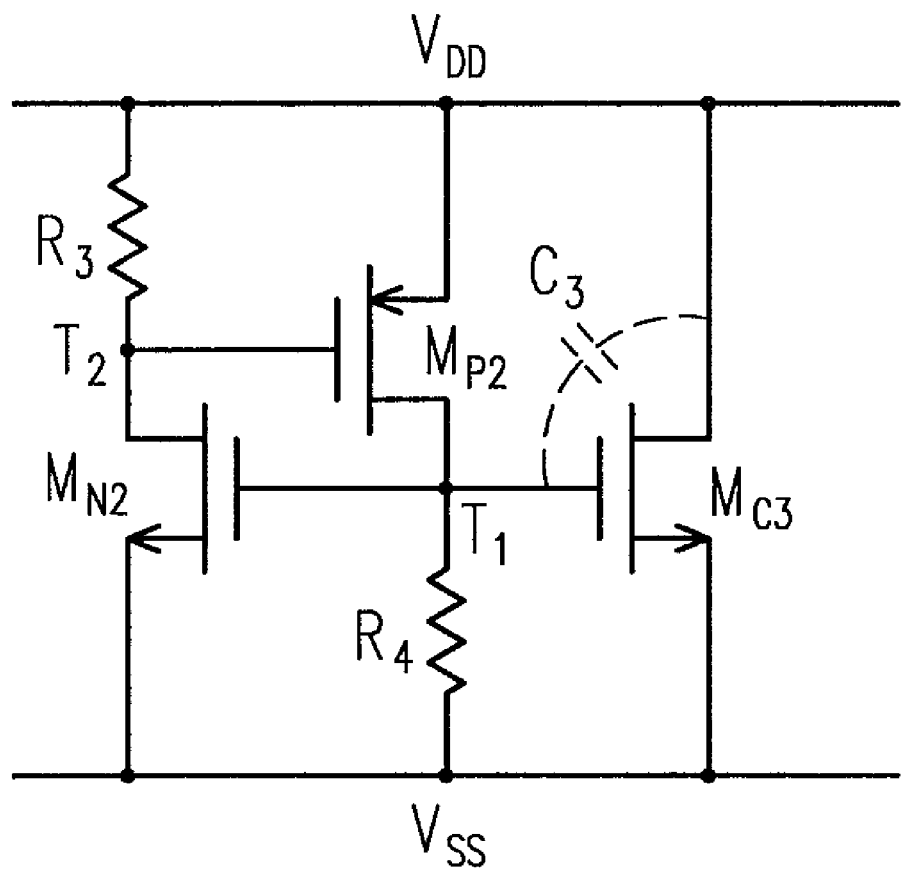
FIG. 3 is an ESD clamp circuit diagram according to an exemplary embodiment consistent with the present invention.

FIG. 3 is an electrostatic discharge (ESD) clamp circuit diagram according to an exemplary embodiment consistent with the present invention. Referring to FIG. 3, an ESD clamp circuit 300 includes a first resistor $R_3$, a second resistor $R_4$, a first transistor $M_{N2}$, a second transistor $M_{P2}$, and a third transistor $M_{C3}$. In this embodiment, the first transistor $M_{N2}$ is an NMOS transistor, the second transistor $M_{P2}$ is a PMOS transistor, the third transistor $M_{C3}$ is an n-channel big field effect transistor (BIGFET), but the present invention is not so limited. A first end of the resistor $R_3$ is coupled to a first rail (for example, a power rail $V_{DD}$), a second end of the resistor $R_4$ is coupled to a second rail (for example, a power rail $V_{SS}$). Although the ESD clamp circuit 300 is arranged between the power rail $V_{DD}$ and $V_{SS}$ in this embodiment, those of ordinary skills in the art can derive applications to various rails according to the teachings of this embodiments.

A control end (for example, a gate) of the transistor $M_{N2}$ is coupled to a first end of the resistor $R_4$, a first end (for example, a drain) of the transistor $M_{N2}$ is coupled to a second end of the resistor $R_3$, and a second end (for example, a source) of the transistor $M_{N2}$ is coupled to the power rail $V_{SS}$. A control end (for example, a gate) of the transistor $M_{P2}$ is coupled to the second end of the resistor $R_3$, a first end (for example, a source) of the transistor $M_{P2}$ is coupled to the power rail $V_{DD}$, and a second end (for example, a drain) of the transistor $M_{P2}$ is coupled to the first end of the resistor $R_4$. A control end (for example, a gate) of the transistor $M_{C3}$ is coupled to the first end of the resistor $R_4$, a first end (for example, a drain) of the transistor $M_{C3}$ is coupled to the power rail $V_{DD}$, and the second end (for example, a source) of the transistor $M_{C3}$ is coupled to the power rail $V_{SS}$.

Figure 4A:
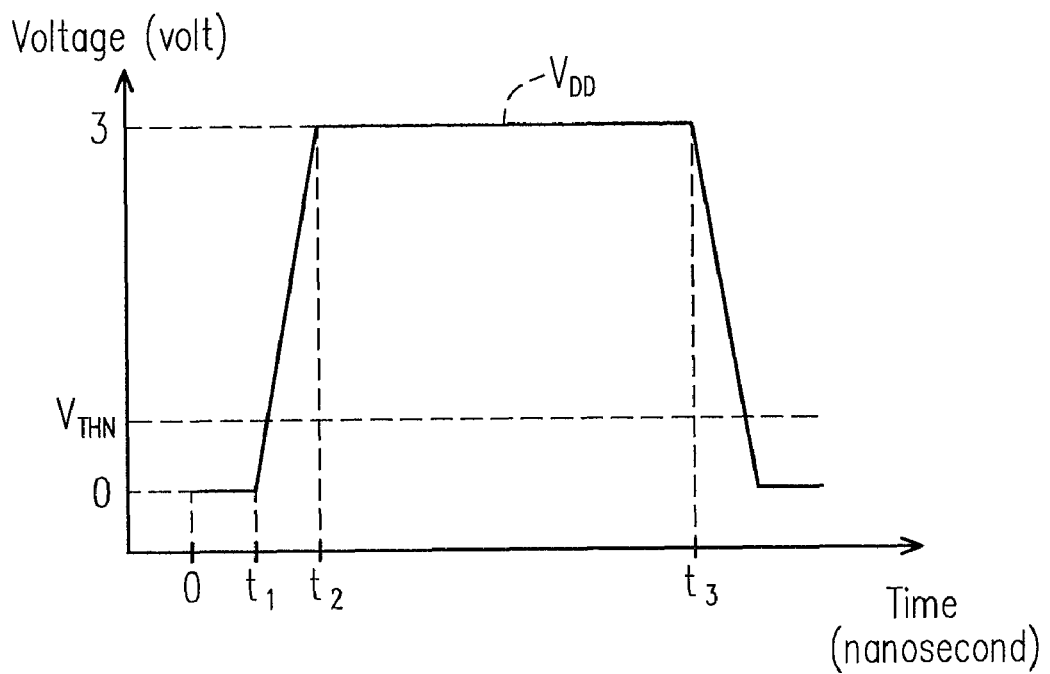
FIG. 4A is a signal simulation diagram when an ESD occurs to a power rail $V_{DD}$ in FIG. 3 and FIG. 1.

Because the transistor $M_{C3}$ which serves as the clamp device has a relatively large channel width, a relatively large parasitic capacitor $C_3$ exists between the gate and drain of the transistor $M_{C3}$, and therefore, the parasitic capacitor $C_3$ and the resistor $R_4$ form a capacitor-coupling-triggered architecture. FIG. 4A is a signal simulation diagram when an ESD occurs to the power rail $V_{DD}$ in FIG. 3 and FIG. 1. Referring to FIG. 4A, assuming here that the power supply is not obtained, at a time point $t_1$, the ESD occurs to the power rail $V_{DD}$. At a time point $t_2$, the voltage of the power rail $V_{DD}$ is pulled up to 3 V by the static electricity, with a rise time being 5 nanoseconds. At a time point $t_3$, the ESD ends.

Figure 4B:
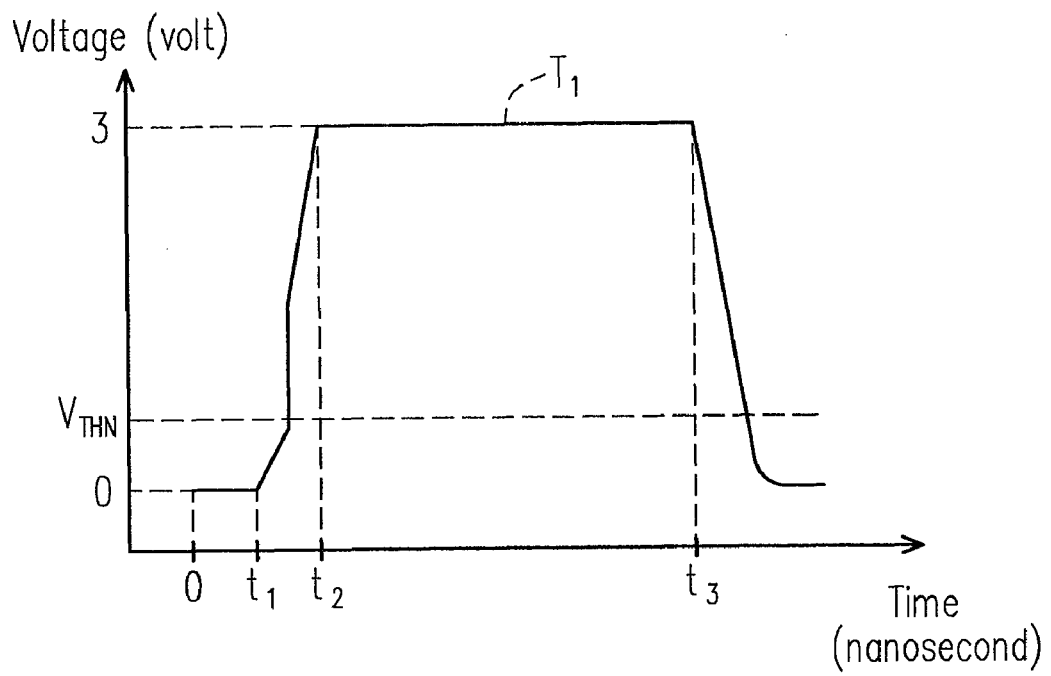
FIG. 4B and FIG. 4C are partial signal simulation diagrams when an ESD occurs to the power rail $V_{DD}$ of the ESD clamp circuit 300 in FIG. 3.
Figure 4C:
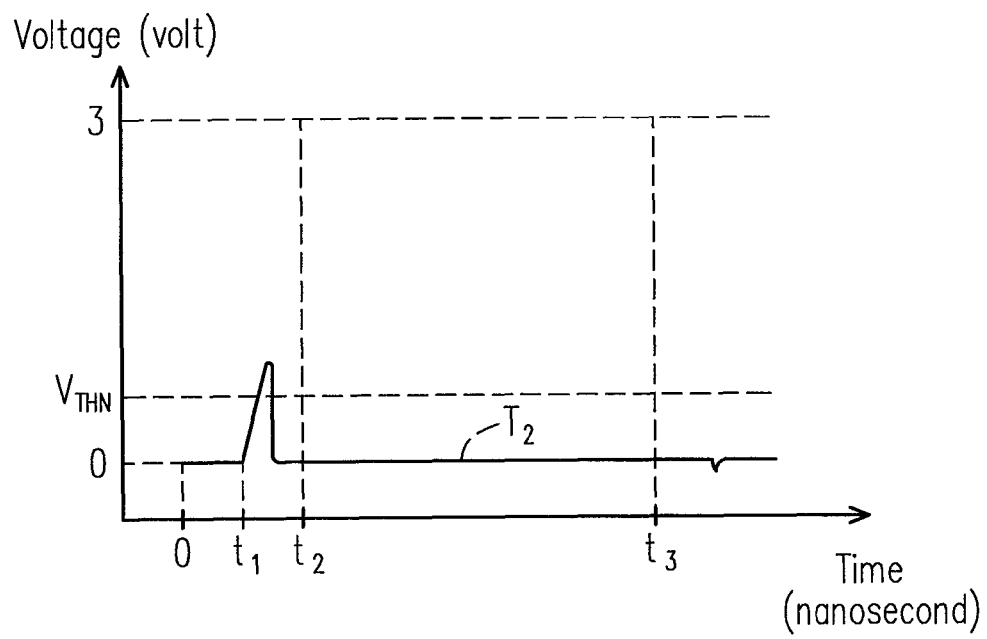

FIG. 4B and FIG. 4C are partial signal simulation diagrams when an ESD occurs to the power rail $V_{DD}$ of the ESD clamp circuit 300 in FIG. 3. Referring simultaneously to FIG. 3 and FIG. 4A-4C, when an ESD occurs to the power rail $V_{DD}$ (at the time point $t_1$), the voltage at a node $T_2$ is also pulled up instantly (as shown in FIG. 4C). When the voltage at the power rail $V_{DD}$ is pulled up quickly, the ESD voltage is coupled to the gate of the transistor $M_{C3}$ via the parasitic capacitor $C_3$, and at this point, the voltage of a node $T_1$ also rises rapidly (as shown in FIG. 4B). The resistor $R_4$ causes the voltage across the gate and the source of the transistor $M_{N2}$ to be greater than its threshold voltage, resulting in that the transistor $M_{N2}$ is turned on. After the transistor $M_{N2}$ is turned on, the voltage of the node $T_2$ is pulled down to a potential of the power rail $V_{SS}$ (assuming that it is 0 V), as shown in FIG. 4C. The current generated when the transistor $M_{N2}$ is turned on flows through the resistor $R_3$, thus generating a voltage across the source and the gate of the transistor $M_{P2}$. When the voltage across the source and the gate of the transistor $M_{P2}$ is greater than the threshold voltage of the transistor $M_{P2}$, the transistor $M_{P2}$ is turned on to pull up the gate voltage of the transistor $M_{C3}$. When the voltage across the source and the gate of the transistor $M_{C3}$ is greater than its threshold voltage $V_{THN}$, the transistor $M_{C3}$ forms a low-impedance path, thus discharging the ESD current form the power rail $V_{DD}$ to the power rail $V_{SS}$.

Likewise, because its gate voltage is pulled up, the transistor $M_{N2}$ generates an even greater current flowing through the resistor $R_3$, such that the voltage across the source and the gate of the transistor $M_{P2}$ is much greater, which further pulls up the gate voltage of the transistor $M_{C3}$, making the ESD current at the power rail $V_{DD}$ be discharged to the power rail $V_{SS}$ more rapidly. In other words, the resistor $R_3$, the resistor $R_4$, the transistor $M_{N2}$, and the transistor $M_{P2}$ form a feedback scheme, which turns on the transistor $M_{C3}$ based on the occurrence of the ESD. That is to say, the length of occurrence time of the ESD determines the turn-on time of the transistor $M_{C3}$.

When the ESD ends (at the time point $t_3$), the voltage of the node $T_1$ is lowered with the voltage of the power rail $V_{DD}$ (as shown in FIG. 4B). The voltage across the gate and the source of the transistor $M_{N2}$ drops, such that the voltage across the gate and the source of the transistor $M_{P2}$ also drops accordingly, and the channel of the transistor $M_{C3}$ is turned off gradually. Finally, the transistors $M_{N2}$, $M_{P2}$ and $M_{C3}$ cannot be maintained to be turned on, and at this point, the voltage levels of the two power rails $V_{DD}$ and $V_{SS}$ tend to be identical (that is, 0 V).

Figure 4D:
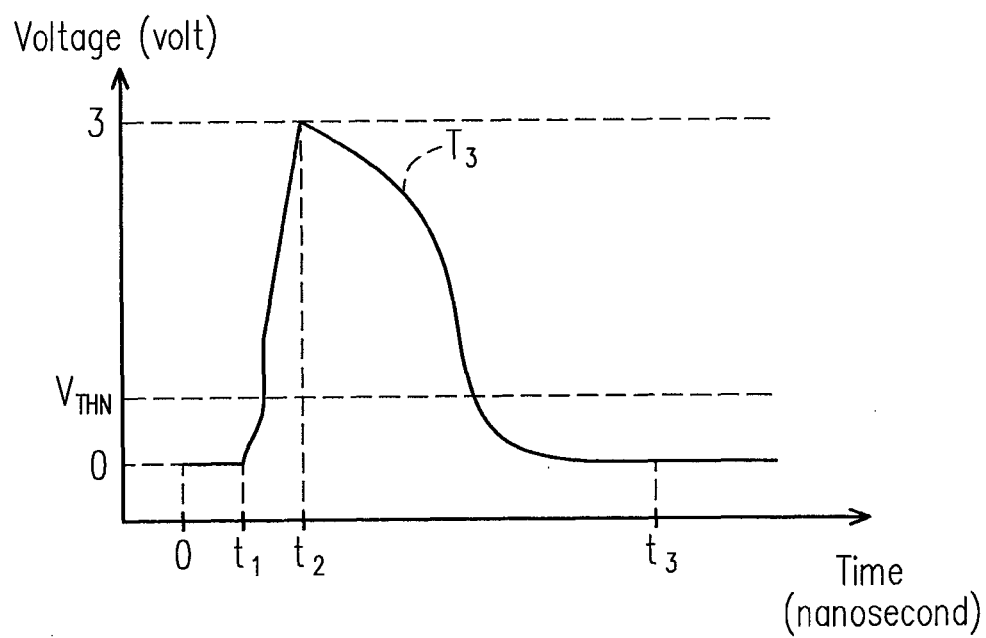
FIG. 4D is a partial signal simulation diagram when an ESD occurs to the power rail $V_{DD}$ of the ESD clamp circuit 100 in FIG. 1.

As for the conventional ESD clamp circuit, the channels of its transistors cannot maintain a state of being turned on for a long time during the occurrence of the ESD. FIG. 4D is a partial signal simulation diagram when an ESD occurs to the power ail $V_{DD}$ of the ESD clamp circuit 100 in FIG. 1. Referring simultaneously to FIG. 1, FIG. 4A, and FIG. 4D, when the voltage of the power rail $V_{DD}$ is pulled up to 3 V by the static electricity (at time points $t_1$-$t_2$), the resistor $R_1$ causes that the input terminal of the inverter 101 is maintained at a low potential, and therefore, the voltage of the node $T_3$ is pulled up to a high potential, that is, close to 3 V. After that, as the capacitor $C_1$ starts to be charged, the voltage of the input terminal of the inverter 101 rises gradually, and the voltage of the node $T_3$ drops gradually. When the voltage of the node $T_3$ is lower than the threshold voltage $V_{THN}$ of the transistor $M_{C1}$, the channel of the transistor $M_{C1}$ cannot be maintained a state of being turned on. Therefore, the conventional ESD clamp circuit 100 may turn off the transistor $M_{C1}$ in advance before the ESD ends, such that the core circuit 103 is faced with the impact of the ESD. In other words, the time constant of the RC circuit in the conventional ESD clamp circuit 100 must be increased in order to discharge the ESD current efficiently.

Figure 5A:
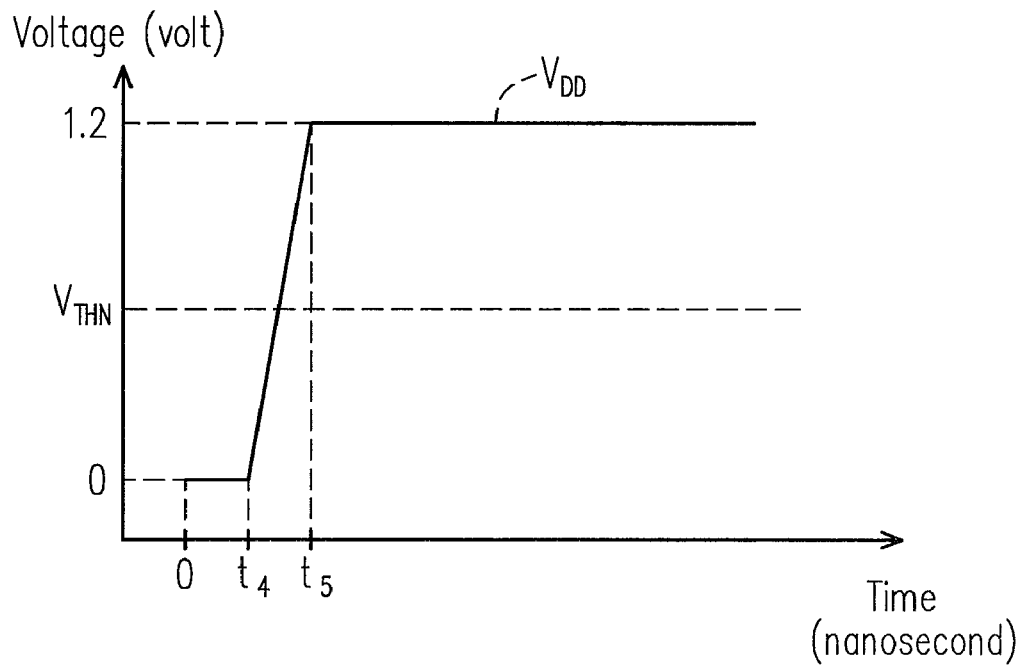
FIG. 5A is a signal simulation diagram when the power rail $V_{DD}$ in FIG. 3
Figure 5B:
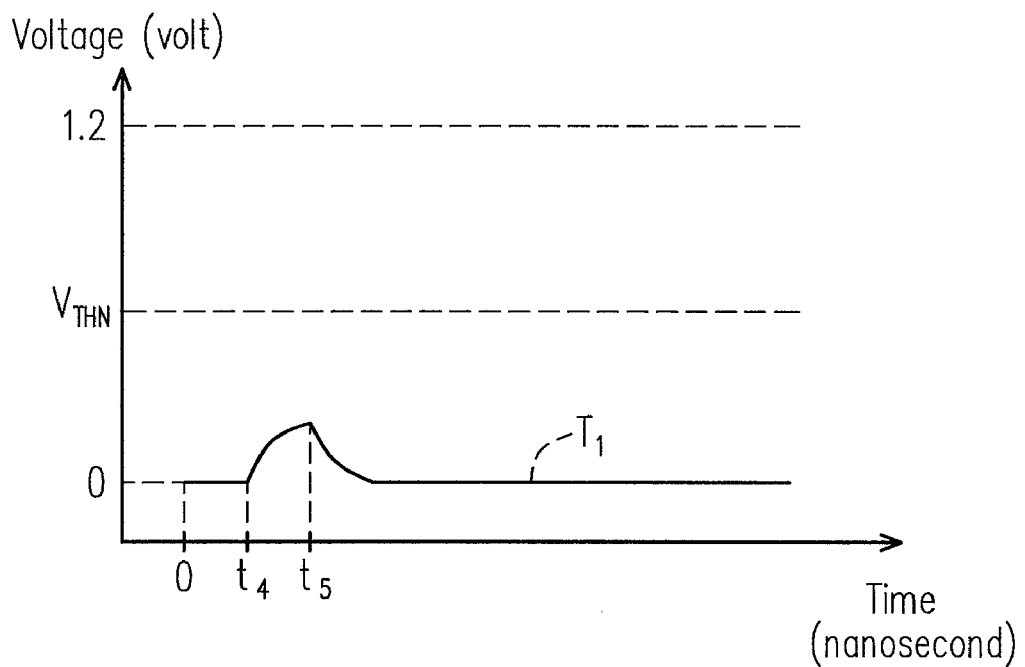
Figure 5C:
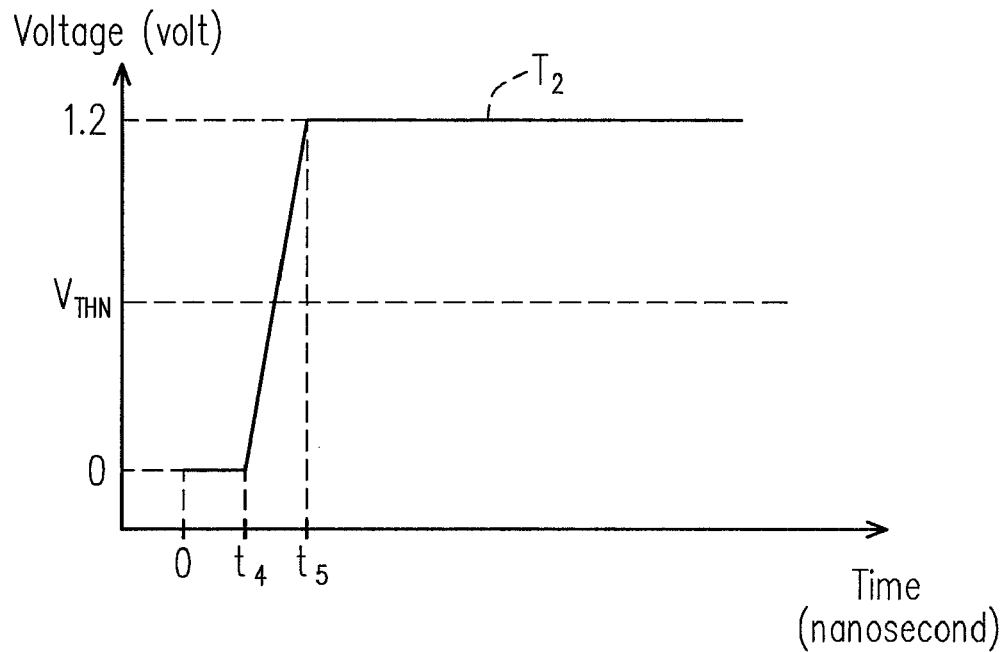

FIG. 5A is a signal simulation diagram when the power rail $V_{DD}$ in FIG. 3 and FIG. 1 is under fast power-on. Referring to FIG. 5A, at a time-point $t_4$, the power is initiated rapidly, and it is assumed that the voltage of the power rail $V_{DD}$ is pulled up to 1.2 V at a time point $t_5$, with a rise time being 10 nanoseconds. FIG. 5B and FIG. 5C are partial signal simulation diagrams when the ESD clamp circuit 300 in FIG. 3 is under fast power-on. Referring to FIG. 3 and FIG. 5A-5C, when the voltage of the power rail $V_{DD}$ rises fast, with the coupling effect of the parasitic capacitor $C_3$, the voltage of the node $T_1$ also rises but still maintains below the threshold voltage $V_{THN}$ of the transistor $M_{C3}$ (as shown in FIG. 5B). Because the voltage of the node $T_1$ is not sufficient to drive the transistor $M_{N2}$, the transistor $M_{N2}$ remains in a turn-off state, and the voltage of the node $T_2$ may rise as the voltage of the power rail $V_{DD}$ increases (as shown in FIG. 5C). The voltage of the node $T_2$ remains to be nearly identical to the voltage of the power rail $V_{DD}$, such that the transistor $M_{P2}$ remains in the turn-off state. After the power rail $V_{DD}$ rises to a stable voltage of 1.2 V, the voltage of node $T_1$ trends toward the voltage level of the power rail $V_{SS}$, that is, 0 V.

Figure 5D:
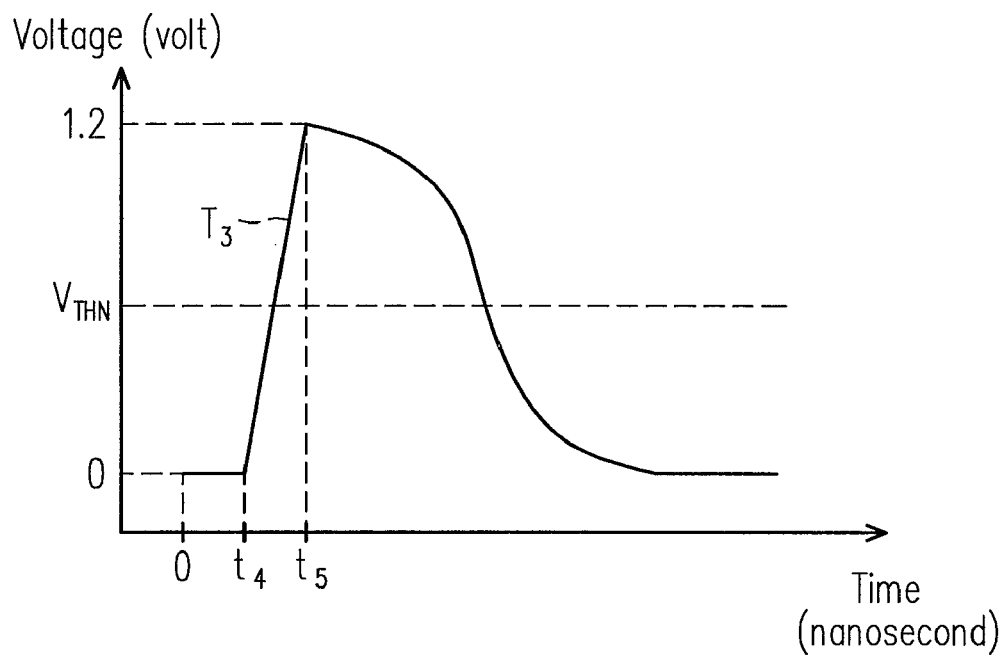

In comparison, referring to FIG. 1, FIGS. 5A and 5D, when the voltage of the power rail $V_{DD}$ rises fast, the voltage of the node $T_3$ has exceeded the threshold voltage $V_{THN}$ of the transistor $M_{C1}$, resulting in that the transistor $M_{C1}$ is triggered wrongly to be turned on. In other words, the time constant of the RC circuit must be reduced to effectively avoid the ESD clamp circuit 100 from being triggered wrongly. Therefore, in the case of fast power-on, the ESD clamp circuit 300 has the capability of avoiding being triggered wrongly.

Figure 6:
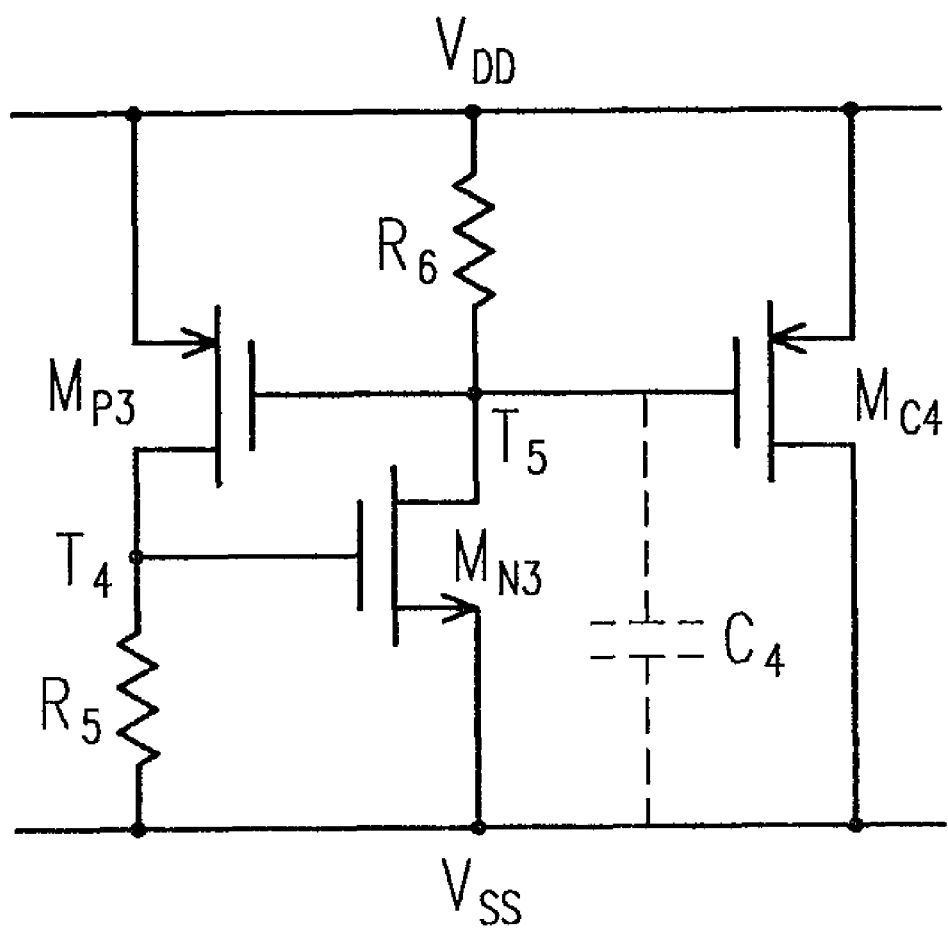
FIG. 6 is an ESD clamp circuit diagram according to an exemplary embodiment consistent with the present invention.

FIG. 6 is an ESD clamp circuit diagram according to an exemplary embodiment consistent with the present invention. Referring to FIG. 6, an ESD clamp circuit 400 includes a first resistor $R_5$, a second resistor $R_6$, a first transistor $M_{P3}$, a second transistor $M_{N3}$, and a third transistor $M_{C4}$. In this embodiment, the first transistor $M_{P3}$ is a PMOS transistor, the second transistor $M_{N3}$ is an NMOS transistor, the third transistor $M_{C4}$ is a p-channel BIGFET, but the present invention is not so limited. A first end of the resistor $R_5$ is coupled to a first rail (for example, a power rail $V_{SS}$), a second end of the resistor $R_6$ is coupled to a second rail (for example, a power rail $V_{DD}$). A control end (for example, a gate) of the transistor $M_{P3}$ is coupled to a first end of the resistor $R_6$, a first end (for example, a drain) of the transistor $M_{P3}$ is coupled to a second end of the resistor $R_5$, and a second end (for example, a source) of the transistor $M_{P3}$ is coupled to the power rail $V_{DD}$. A control end (for example, a gate) of the transistor $M_{N3}$ is coupled to the second end of the resistor $R_5$, a first end (for example, a source) of the transistor $M_{N3}$ is coupled to the power rail $V_{SS}$, and a second end (for example, a drain) of the transistor $M_{N3}$ is coupled to the first end of the resistor $R_6$. A control end (for example, a gate) of the transistor $M_{C4}$ is coupled to the first end of the resistor $R_6$, a first end (for example, a drain) of the transistor $M_{C4}$ is coupled to the power rail $V_{SS}$, and a second end (for example, a source) of the transistor $M_{C4}$ is coupled to the power rail $V_{DD}$.

Figure 7A:
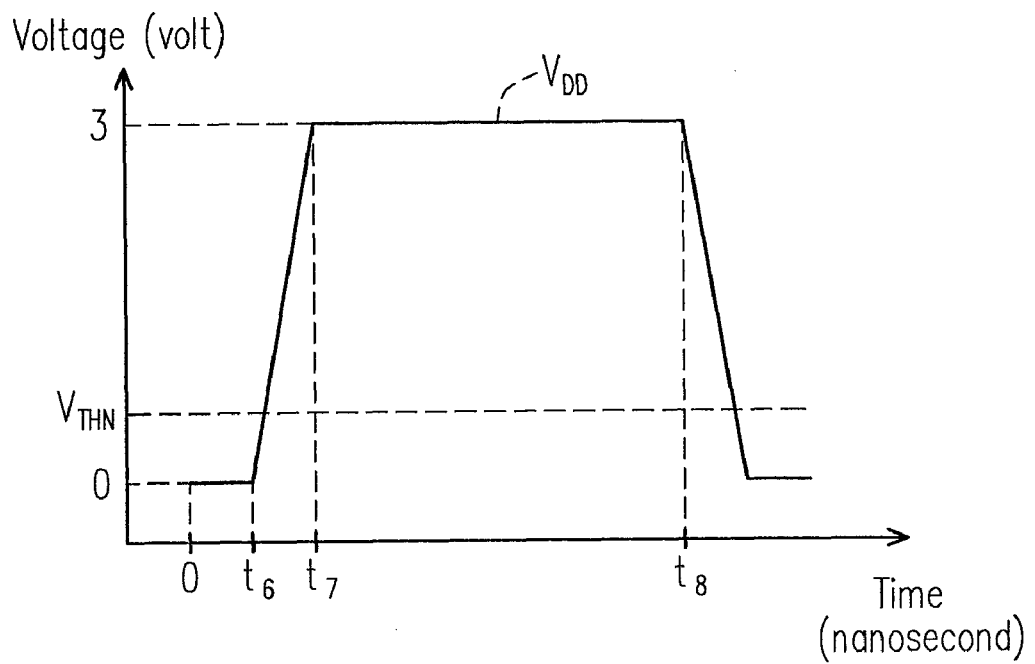
FIG. 7A is a signal simulation diagram when an ESD occurs to the power rail $V_{DD}$ in FIG. 6.

Among these, the transistor $M_{C4}$ which serves as a clamp device has a relatively large channel width. Therefore, a relatively large parasitic capacitor $C_4$ exists between the gate and the drain of the transistor $M_{C4}$, and the resistor $R_6$ and the parasitic capacitor $C_4$ form a RC time-delay-triggered architecture. FIG. 7A is a signal simulation diagram when an ESD occurs to the power rail $V_{DD}$ in FIG. 6. Referring to FIG. 7A, assuming here that the power supply is not obtained, at a time point $t_6$, the ESD occurs to the power rail $V_{DD}$. At a time point $t_7$, the voltage of the power rail $V_{DD}$ is pulled to 3 V by the static electricity, with a rise time being 5 nanoseconds. At a time point $t_8$, the ESD ends.

Figure 7B:
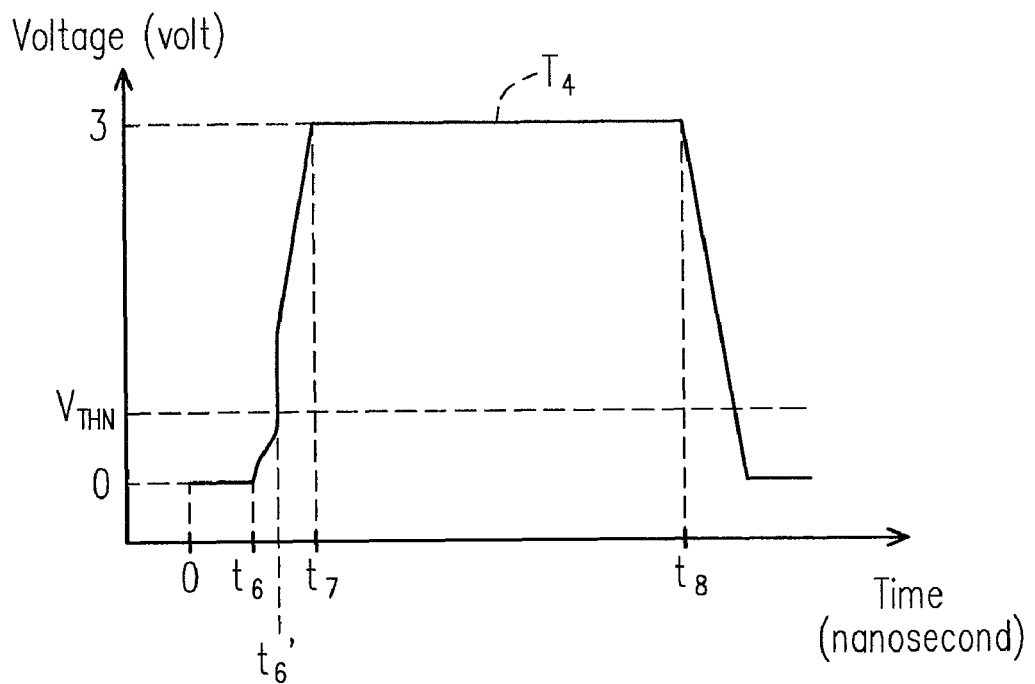
FIG. 7B and FIG. 7C are partial signal simulation diagrams when an ESD occurs to the ESD clamp circuit 400 in FIG. 6.
Figure 7C:
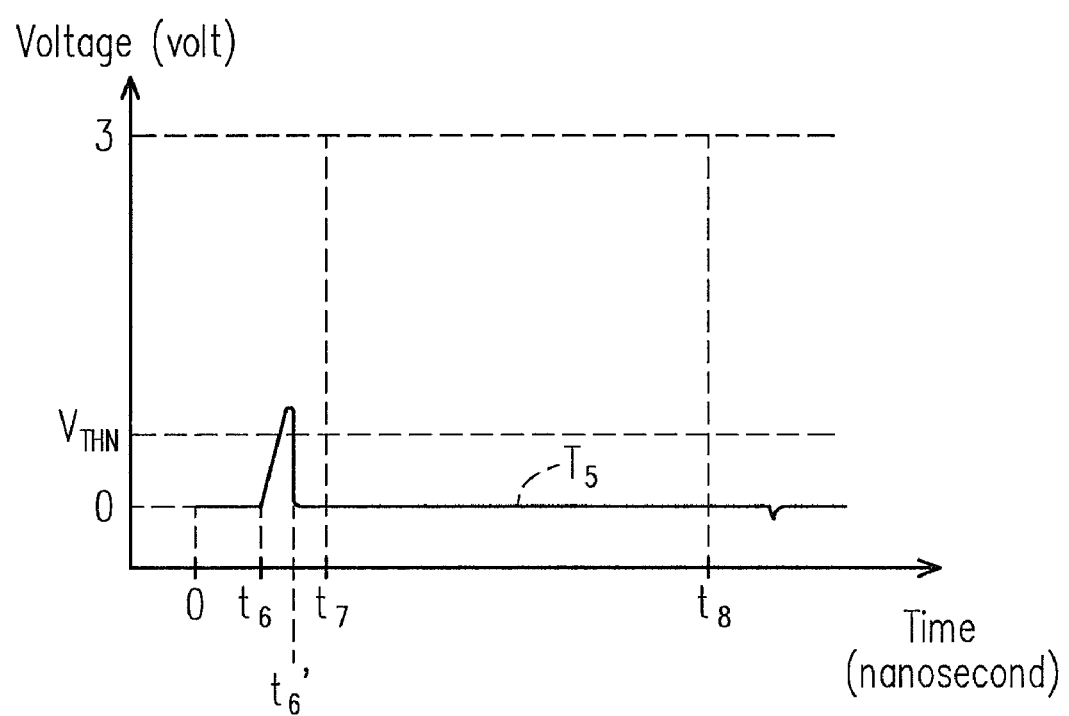

FIG. 7B and FIG. 7C are partial signal simulation diagrams when an ESD occurs to the ESD clamp circuit 400 in FIG. 6. Referring simultaneously to FIG. 6 and FIG. 7A-7C, when the ESD occurs to the power rail $V_{DD}$ (at the time point $t_6$), due to the delay effect of the RC circuit, the parasitic capacitor $C_4$ makes the voltage of a node $T_5$ at a low potential to turn on the transistor $M_{P3}$. Therefore, during the time period between time points $t_6$ to $t_6'$, the voltages of both the nodes $T_4$ and $T_5$ may rise with the voltage level of the power rail $V_{DD}$ (as shown in FIG. 7B, FIG. 7C). The current generated by the turned-on transistor $M_{P3}$ flows through the resistor $R_5$, thus generating a voltage across the gate and the source of the transistor $M_{N3}$. When the voltage (that is, the voltage of the node $T_4$) exceeds the threshold voltage $V_{THN}$ of the transistor $M_{N3}$, that is, at the time point $t_6'$, the transistor $M_{N3}$ may be turned on, such that the voltage of the node $T_5$ (that is, the gate voltage of the transistor $M_{C4}$) is pulled down to be close to the voltage level of the power rail $V_{SS}$ (as shown in FIG. 7C). Therefore, the transistor $M_{C4}$ forms a low-impedance path, thus discharging the ESD current from the power rail $V_{DD}$ to the power rail $V_{SS}$.

The transistor $M_{P3}$ generates an even greater current because its gate is at a low potential, such that the voltage across the gate and the source of the transistor $M_{N3}$ is even greater, which further pulls down the gate of the transistor $M_{C4}$, making the ESD current be discharged to the power rail $V_{SS}$ more rapidly. In other words, the resistor $R_5$, the resistor $R_6$, the transistor $M_{N3}$, and the transistor $M_{P3}$ form a feedback scheme, which turns on the transistor $M_{C4}$ based on the occurrence of the ESD. That is to say, the length of occurrence time of the ESD determines the turn-on time of the transistor $M_{C4}$.

When the ESD ends (at the time point $t_8$), the voltage of the node $T_4$ drops with the voltage of the power rail $V_{DD}$ (as shown in FIG. 7B). The voltage across the gate and the source of the transistor $M_{N3}$ reduces, such that the voltage across the gate and the source of the transistor $M_{P3}$ also reduces accordingly, thus turning off the channel of the transistor $M_{C4}$ gradually. Finally, the transistors $M_{P3}$, $M_{N3}$ and $M_{C4}$ cannot be maintained to be turned on, and at this point, the voltage levels of the two power rails $V_{DD}$ and $V_{SS}$ tend to be identical (that is, 0 V).

Figure 8A:
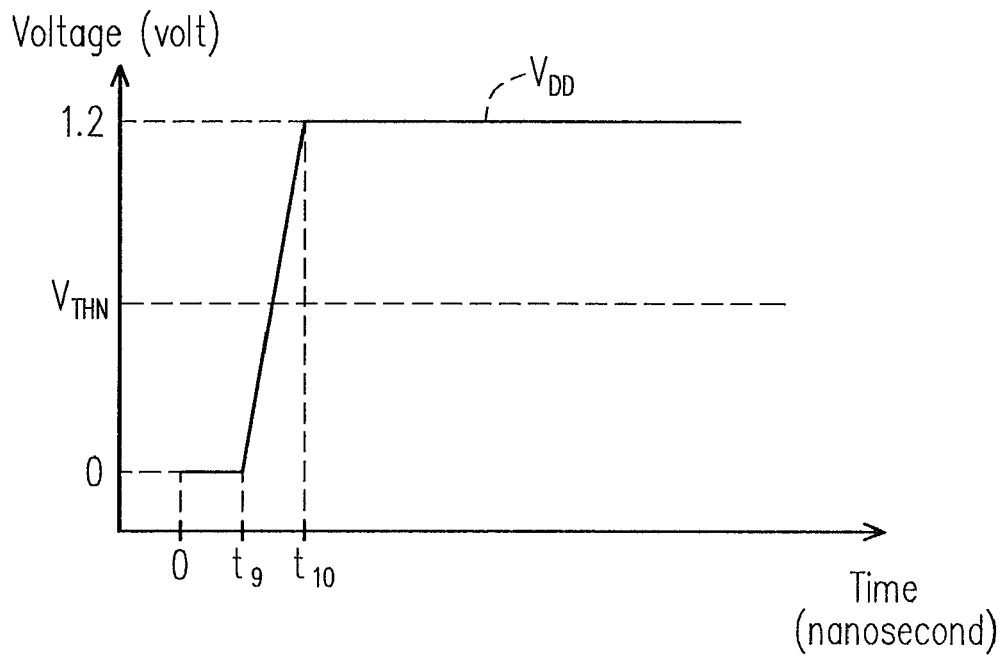
Figure 8B:
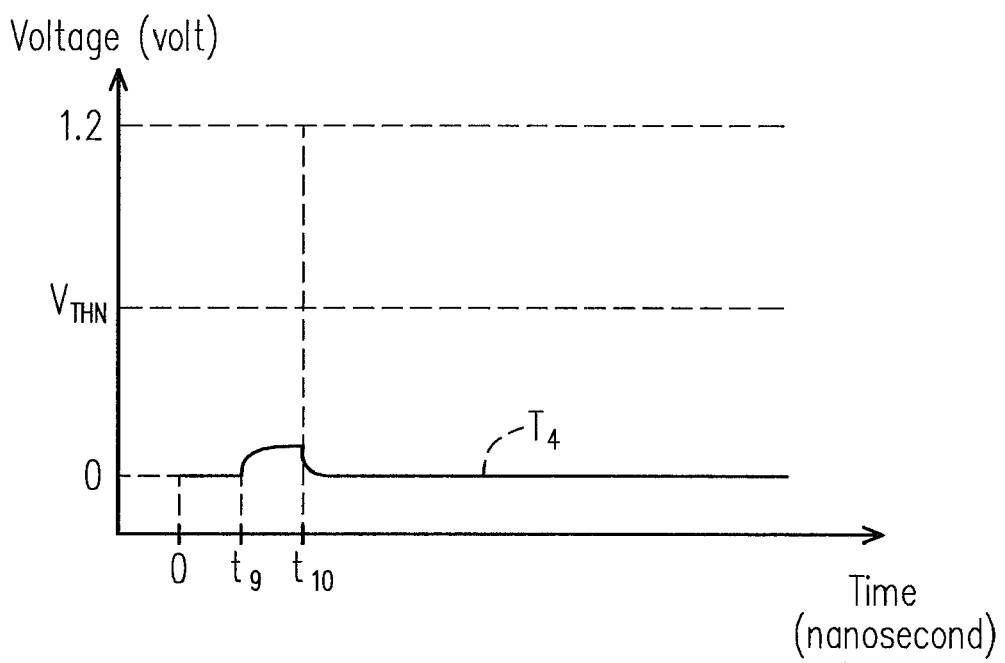
Figure 8C:
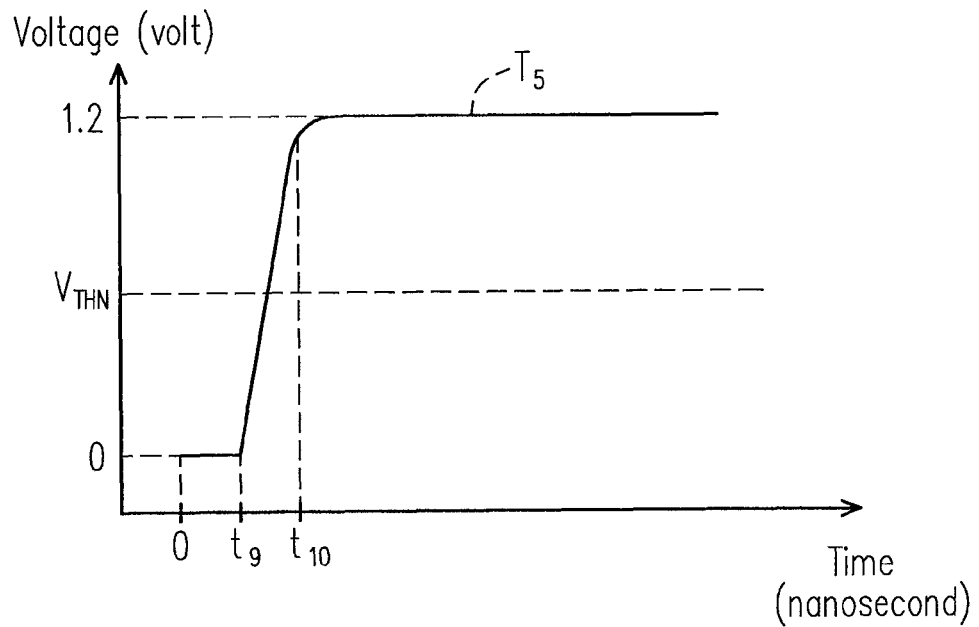

FIG. 8A is a signal simulation diagram when the power rail $V_{DD}$ in FIG. 6 is under fast power-on. Referring to FIG. 8A, assuming that the power is initiated fast at a time point $t_9$, the voltage of the power rail $V_{DD}$ is pulled up to 1.2 V at a time point $t_{10}$, with a rise time being 10 nanoseconds. FIG. 8B and FIG. 8C are partial signal simulation diagrams when the ESD clamp circuit 400 in FIG. 6 is under fast power-on. Referring simultaneously to FIG. 6 and FIG. 8A-8C, when the voltage of the power rail $V_{DD}$ rises fast (at time points $t_9$-$t_{10}$), because the voltage of the node $T_5$ can meet up with the voltage of the power rail $V_{DD}$ (as shown in FIG. 8C), the channels of the transistor $M_{P3}$ and the transistor $M_{C4}$ are turned off. In the state of the transistor $M_{P3}$ remaining to be turned off, the voltage of the node $T_4$ may remain lower than the threshold voltage $V_{THN}$, thereby making the transistor $M_{N3}$ remain to be turned off. Therefore, in the case of fast power-on, the ESD clamp circuit 400 has the capability of avoiding to be triggered wrongly.

In normal application, that is, in the case that the power rail $V_{DD}$ obtains the power supply, both the above ESD clamp circuits 300 and 400 have a considerable degree of noise interference resistance, and may not trigger the transistors $M_{C3}$ and $M_{C4}$ wrongly to cause short circuits of the two power rails $V_{DD}$ and $V_{SS}$. However, when the ESD clamp circuit is triggered when suffering from very large noise interference (or ESD), after the noise interference disappears, a latch-on phenomenon may occur to the ESD clamp circuit. Referring to FIG. 6, assuming that the power rail $V_{DD}$ obtains the power supply, when the ESD clamp circuit 400 encounters noises, a voltage across the two ends of the resistor $R_6$ is generated to turn on the transistor $M_{P3}$, and at this point, the transistor $M_{N3}$ is turned on according to the feedback scheme of the ESD clamp circuit 400, and the transistor $M_{C4}$ is driven to be turned on. When the noises disappear, the voltage of the power rail $V_{DD}$ can support the continuous operation of the feedback scheme, thus resulting in that the transistor $M_{C4}$ continues to be in a turn-on state, which is the latch-on phenomenon.

Figure 9:
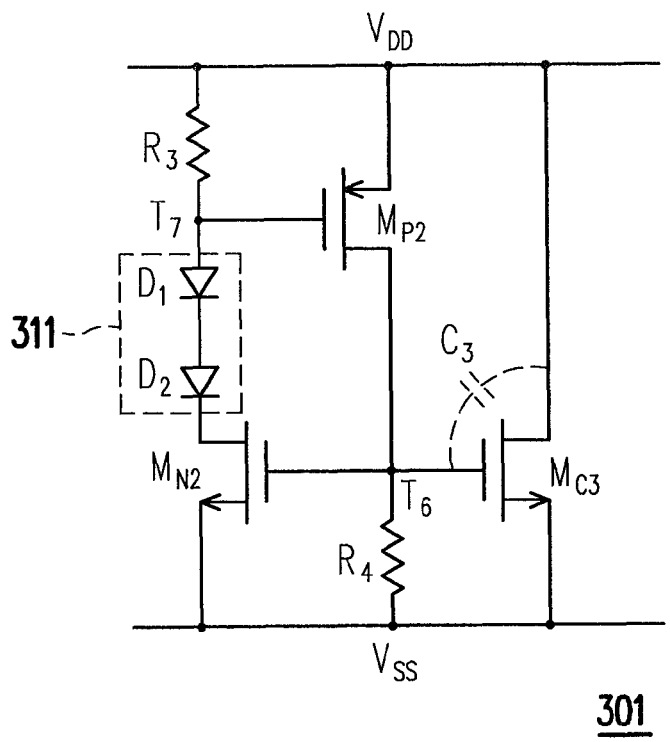
FIG. 9 is an ESD clamp circuit diagram according to an exemplary embodiment consistent with the present invention.

FIG. 9 is an ESD clamp circuit diagram according to an exemplary embodiment consistent with the present invention. Referring to FIG. 3 and FIG. 9, the ESD clamp circuit 301 is similar to the ESD clamp circuit 300, so only the differences between them are illustrated below. Referring to FIG. 9, the ESD clamp circuit 301 further includes a first diode unit 311. In this embodiment, the diode unit 311 is a diode string of two diodes $D_1$ and $D_2$ connected in series, but the present invention is not so limited. An anode end of the diode $D_1$ is coupled to the second end of the resistor $R_3$, a cathode end of the diode $D_1$ is coupled to an anode end of the diode $D_2$, and a cathode end of the diode $D_2$ is coupled to the drain of the transistor $M_{N2}$. Those of ordinary skills in the art can modify the number of the diodes correspondingly according to the specification of this embodiment in actual application. For example, assuming that the turn-on voltage for the diodes $D_1$ and $D_2$ is 0.6 V, then the turn-on voltage for the diode unit 311 is 1.2 (0.6×2) V. When a forward bias greater than 1.2 V is applied to the two ends of the diode unit 311, the diode unit 311 may be turned on. In this embodiment, the turn-on voltage for the diode unit 311 is greater than or equal to the working voltage of the power rail $V_{DD}$. How to utilize such a physical characteristic to avoid latch-on phenomenon is illustrated below.

Figure 10A:
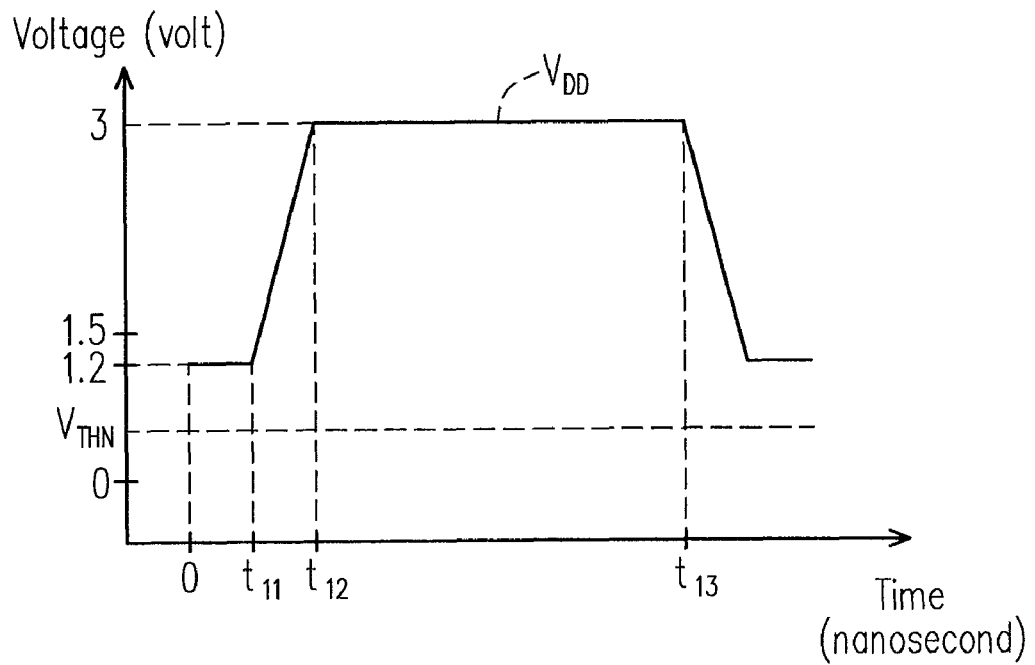
FIG. 10A is a signal simulation diagram when the power rail $V_{DD}$ in FIG. 9 is suffering from noise interference.
Figure 10B:
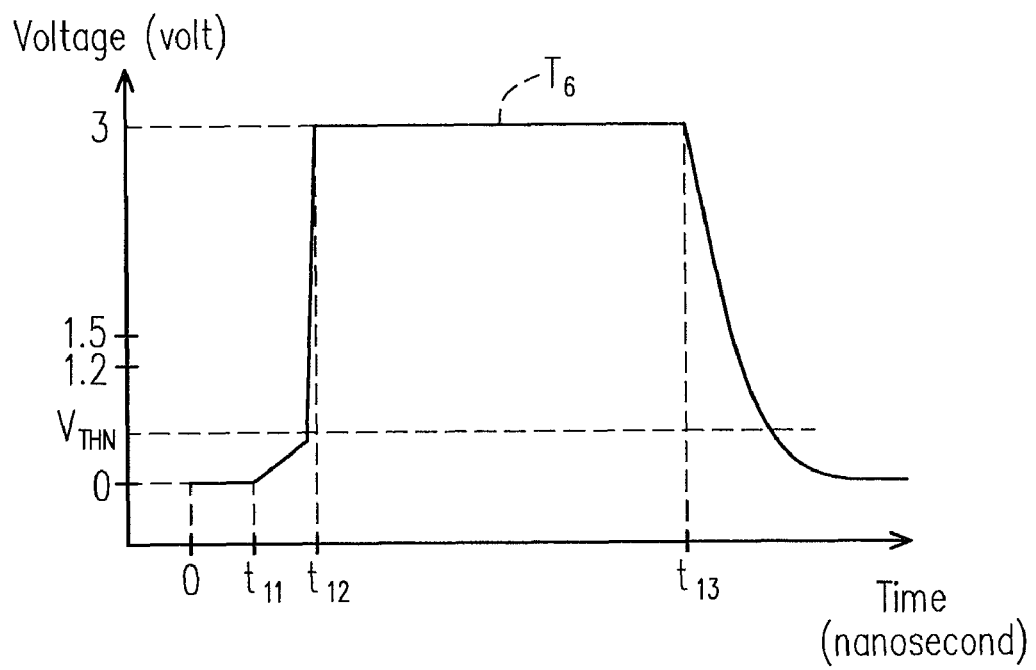
FIG. 10B and FIG. 10C are partial signal simulation diagrams when the ESD clamp circuit 301 in FIG. 9 is suffering from noise interference.
Figure 10C:
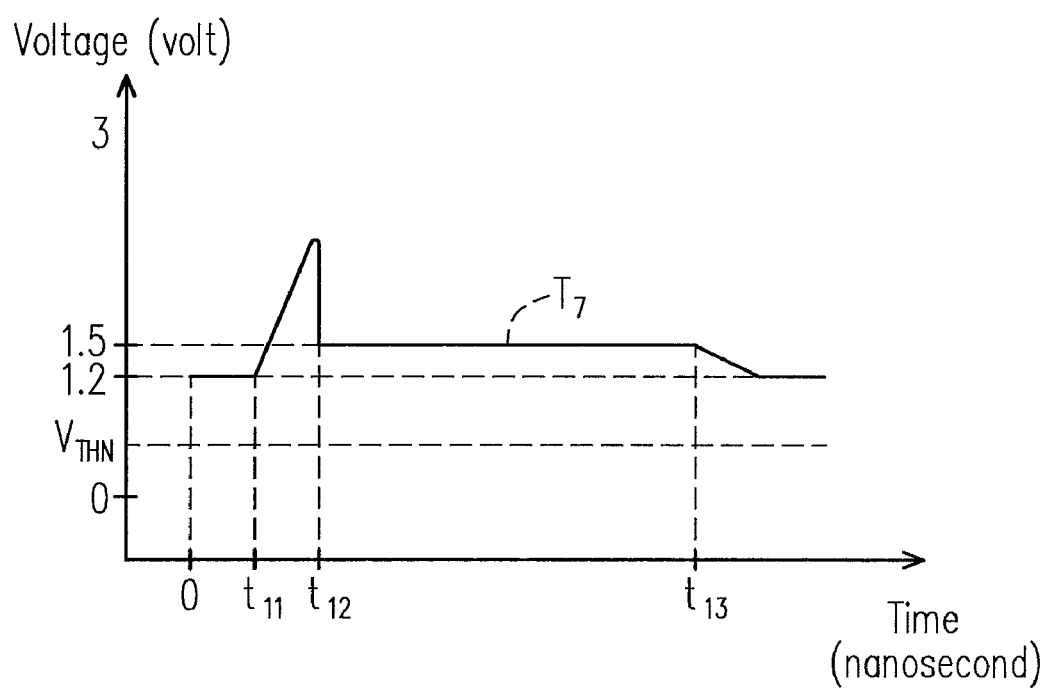

FIG. 10A is a signal simulation diagram when the power rail $V_{DD}$ in FIG. 9 is suffering from noise interference. Assuming here that the power rail $V_{DD}$ is suffering from noise interference at a time point $t_{11}$, the voltage of the power rail $V_{DD}$ is pulled up from 1.2 V to 3 V (at a time point $t_{12}$), with a voltage rise time being 3 nanoseconds. FIGS. 10B and 10C are partial signal simulation diagrams when the ESD clamp circuit 301 in FIG. 9 is suffering from noise interference. When the ESD clamp circuit 301 is triggered to operate when suffering from noise interference, the feedback scheme of the ESD clamp circuit 301 is initiated due to the coupling effect of the capacitor $C_3$. During the time points $t_{11}$-$t_{12}$, when the voltage of a node $T_7$ is greater than the turn-on voltage for the diode unit 311 (as shown in FIG. 10C), the voltage of the node $T_6$ also rises accordingly (as shown in FIG. 10B) to drive the transistor $M_{C3}$. During the time points $t_{12}$-$t_{13}$, by utilizing the forward bias physical characteristic of the diode unit 311, the voltage of the node $T_7$ may be maintained approximately around 1.5 V.

After the noise disappears (at time point $t_{13}$), the voltage of the power rail $V_{DD}$ returns to 1.2 V, and at this point, with the characteristic of the diode unit 311, the voltage of the node $T_7$ may be approximately equal to the voltage of the power rail $V_{DD}$. Because the voltage across the source and the gate of the transistor $M_{P2}$ after the voltage of the power rail $V_{DD}$ returns to 1.2 V is lower than its threshold voltage, the transistor $M_{P2}$ may be turned off, thereby pulling down the voltage of the node $T_6$ (as shown in FIG. 10B). Therefore, after the noise disappears, the channel of the transistor $M_{C3}$ is also turned off accordingly.

Figure 11:
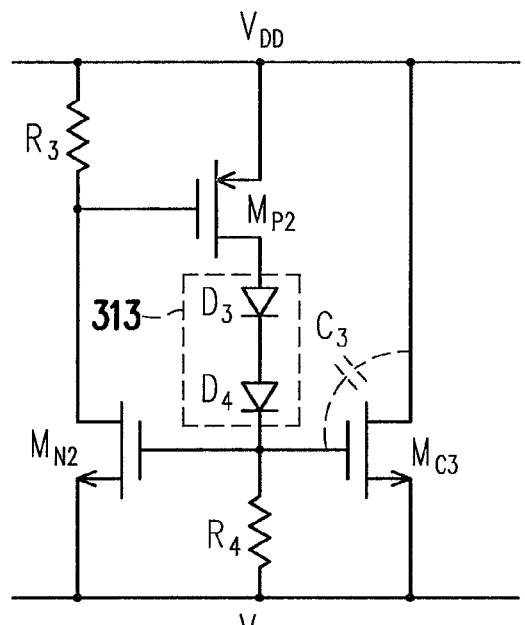
FIGS. 11-14 are ESD clamp circuit diagrams according to an embodiment of the present invention.

According to the above illustration, the ESD clamp circuit described in the present invention can be implemented in other ways. FIG. 11 is an ESD clamp circuit diagram according to an embodiment of the present invention. Referring to FIG. 3 and FIG. 11, the operation of the ESD clamp circuit 303 is similar to that of the ESD clamp circuit 300. Referring to FIG. 11, the ESD clamp circuit 303 further includes a second diode unit 313. The diode unit 313 is a diode string of two diodes $D_3$ and $D_4$ connected in series, but the present invention is not so limited. An anode end of the diode $D_3$ is coupled to the drain of the transistor $M_{P2}$, a cathode end of the diode $D_3$ is coupled to an anode end of the diode $D_4$, and a cathode end of the diode $D_4$ is coupled to the first end of the resistor $R_4$. When the ESD clamp circuit 303 is triggered to operate due to suffering from noise interference, the transistor $M_{C3}$ is driven to be turned on. When the noise disappears, the gate voltage of the transistor $M_{N2}$ drops to be lower than its threshold voltage due to the voltage drop of the diode unit 313. The transistor $M_{N2}$ is turned off because its gate voltage is lower than the threshold voltage, such that the feedback scheme of the ESD clamp circuit 303 cannot maintain its operation, thus turning off the transistor $M_{C3}$. Therefore, the ESD clamp circuit 303 can return to a state before being triggered.

Figure 12:
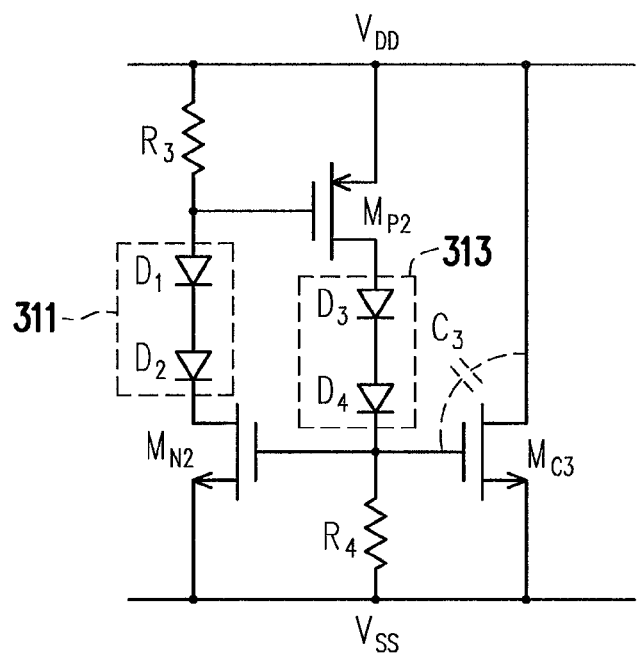

FIG. 12 is an ESD clamp circuit diagram according to an embodiment of the present invention. Referring to FIG. 3 and FIG. 12, the operation of the ESD clamp circuit 305 is similar to that of the ESD clamp circuit 300. Referring to FIG. 12, the ESD clamp circuit 305 further includes a first diode unit 311 and a second diode unit 313. When the ESD clamp circuit 305 is triggered to operate due to suffering from noise interference, the transistor $M_{C3}$ is driven to be turned on. When the noise disappears, with the characteristics of the diode units 311 and 313, the gate voltage of the transistor $M_{P2}$ may be close to the voltage of the power rail $V_{DD}$, and the gate voltage of the transistor $M_{N2}$ may close to the voltage of the power rail $V_{SS}$. The transistors $M_{N2}$ and $M_{P2}$ are turned off because the voltages across their gates and sources are lower than the threshold voltage, so the feedback scheme of the ESD clamp circuit 305 cannot maintain its operation, and the channel of the transistor $M_{C3}$ is also turned off accordingly.

Figure 13:
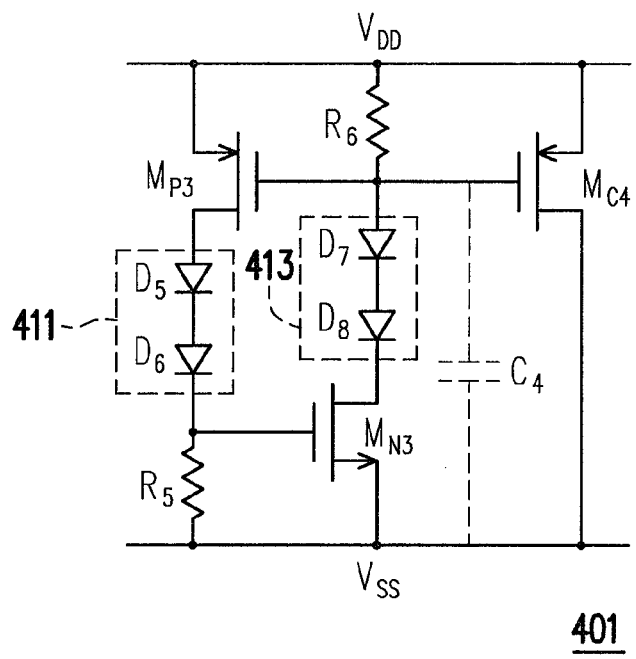

FIG. 13 is an ESD clamp circuit diagram according to an exemplary embodiment consistent with the present invention. Referring to FIG. 6 and FIG. 13, the operation of an ESD clamp circuit 401 is similar to that of the ESD clamp circuit 400. Referring to FIG. 13, the ESD clamp circuit 401 further includes a first diode unit 411 and a second diode unit 413. The diode unit 411 is a diode string of two diodes $D_5$ and $D_6$ connected in series, and the diode unit 413 is a diode string of two diodes $D_7$ and $D_8$ connected in series, but the present invention is not so limited. An anode end of the diode $D_5$ is coupled to the drain of the transistor $M_{P3}$, a cathode end of the diode $D_5$ is coupled to an anode end of the diode $D_6$, and a cathode end of the diode $D_6$ is coupled to the second end of the resistor $R_5$. An anode end of the diode $D_7$ is coupled to the first end of the resistor $R_6$, a cathode end of the diode $D_7$ is coupled to an anode end of the diode $D_8$, and a cathode end of the diode $D_8$ is coupled to the drain of the transistor $M_{N3}$.

After the ESD clamp circuit 401 is triggered when suffering from noise interference, the transistor $M_{C4}$ is turned on to release the noise. When the noise disappears, with the characteristics of the diode units 411 and 413, the gate voltage of the transistor $M_{P3}$ can be close to the voltage of the power rail $V_{DD}$, and the gate voltage of the transistor $M_{N3}$ can be close to the voltage of the power rail $V_{SS}$. The transistors $M_{N3}$ and $M_{P3}$ are turned off because the voltages across their gates and sources are lower than the threshold voltage, so the feedback scheme of the ESD clamp circuit 401 cannot maintain its operation, and the channel of the transistor $M_{C4}$ is also turned off accordingly.

In other embodiments, one of the diode units 411 and 413 in the ESD clamp circuit 401 can be omitted. The number of the diodes in the diode units 411 and 413 can be determined based on design requirements.

Figure 14:
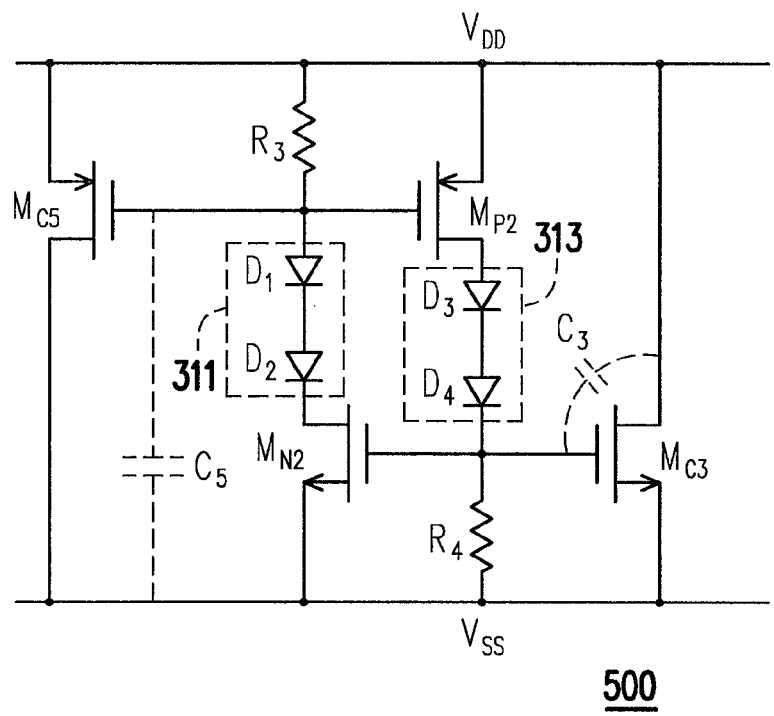

FIG. 14 is an ESD clamp circuit diagram according to an exemplary embodiment consistent with the present invention. Referring to FIG. 12 and FIG. 14, the operation of an ESD clamp circuit 500 is similar to that of the ESD clamp circuit 305. Referring to FIG. 14, the ESD clamp circuit 500 further includes a fourth transistor $M_{C5}$. In this embodiment, the fourth transistor $M_{C5}$ is a p-channel BIGFET, but the present invention is not so limited. A first end (for example, a source) of the transistor $M_{C5}$ is coupled to the power rail $V_{DD}$, a second end (for example, a drain) of the transistor $M_{C5}$ is coupled to the power rail $V_{SS}$, and a control end (for example, a gate) of the transistor $M_{C5}$ is coupled to the second end of the resistor $R_3$. Among these, the transistor $M_{C5}$ which serves as a clamp device has a relatively large channel width, and therefore, a relatively large parasitic capacitor $C_5$ exists between the gate and the drain of the transistor $M_{C5}$. The resistor $R_3$ and the parasitic capacitor $C_5$ form a RC time-delay-triggered architecture, which can enhance the detection of the occurrence of the ESD, and discharge the ESD current to the power rail $V_{SS}$. For example, when an event of ESD occurs, the ESD clamp circuit 500 can be triggered to operate, the feedback scheme formed by the resistor $R_3$, the resistor $R_4$, the transistor $M_{N2}$, and the transistor $M_{P2}$ begins to operate, such that the transistor $M_{C3}$ and the transistor $M_{C5}$ can be turned on to discharge the ESD current.

After the ESD clamp circuit 500 is triggered wrongly due to suffering from excessive noise interference, the feedback scheme formed by the resistor $R_3$, the resistor $R_4$, the transistor $M_{N2}$, and the transistor $M_{P2}$ begins to operate, such that the transistors $M_{C3}$ and the transistor $M_{C5}$ are driven to be turned on. When the noise disappears, with the characteristics of the diode unit 311 and the diode unit 313, the gate voltage of the transistor $M_{P2}$ may be close to the voltage of the power rail $V_{DD}$, and the gate voltage of the transistor $M_{N2}$ may be close to the voltage of the power rail $V_{SS}$. The transistors $M_{N2}$ and $M_{P2}$ are turned off because the voltages across their gates and sources are lower than the threshold voltage, so the feedback scheme of the ESD clamp circuit 500 can be stopped, and the channels of the transistor $M_{C3}$ and the transistor $M_{C5}$ are turned off accordingly.

In other embodiments, one of the diode units 311 and 313 in the ESD clamp circuit 500 can be omitted. Alternatively, both the diode units 311 and 313 can be omitted.

Moreover, in certain embodiments, the diode units shown in FIGS. 9, 11, 12, 13, and 14 can be implemented in other ways. For example, a diode connection structure formed by connecting transistors is used to implement the diodes shown in FIG. 9, 11, 12, 13, or 14. The diode unit 311 in FIG. 12 is taken as an example to be illustrated, and the diode unit 313 or the diode units shown in other drawings can be implemented with reference to the illustration of the diode unit 311.

Figure 15A:
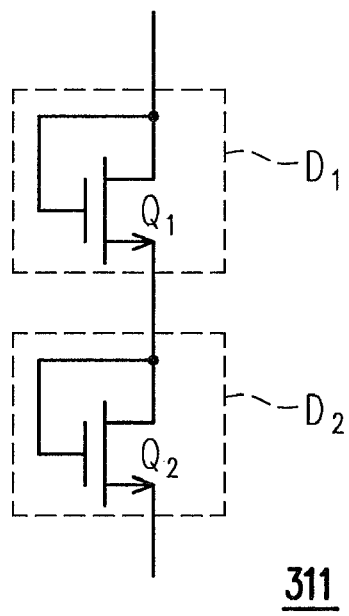
FIG. 15A is a circuit diagram of a first diode unit according to an exemplary embodiment consistent with the present invention.

FIG. 15A is a circuit diagram illustrating the diode unit 311 in FIG. 12 according to an exemplary embodiment consistent with the present invention. Referring to FIG. 15A, the diode unit 311 includes the diodes $D_1$ and $D_2$. In this embodiment, a diode connection structure is formed by connecting NMOS transistors $Q_1$ and $Q_2$ to implement the diodes $D_1$ and $D_2$ respectively. That is to say, a first end (for example, a drain) of the transistor $Q_1$ serves as a first end (for example, an anode) of the diode $D_1$, a second end (for example, a source) of the transistor $Q_1$ serves as a second end (for example, a cathode) of the diode $D_1$, and a control end (for example, a gate) of the transistor $Q_1$ is coupled to the drain of the transistor $Q_1$. Similarly, a first end (for example, a drain) of the transistor $Q_2$ serves as a first end (for example, an anode) of the diode $D_2$, a second end (for example, a source) of the transistor $Q_2$ serves as a second end (cathode) of the diode $D_2$, and a control end (for example, a gate) of the transistor $Q_2$ is coupled to the drain of the transistor $Q_2$.

Figure 15B:
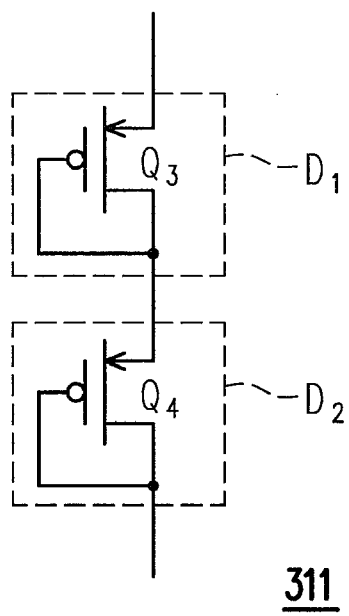
FIG. 15B is a circuit diagram of a first diode unit according to another exemplary embodiment consistent with the present invention.

FIG. 15B is a circuit diagram of the diode unit 311 according to another exemplary embodiment consistent with the present invention. Referring to FIG. 15B, the diode unit 311 includes the diodes $D_3$ and $D_4$. In this embodiment, a diode connection structure is formed by connecting PMOS transistors $Q_3$ and $Q_4$ to implement the diodes $D_1$ and $D_2$ respectively. That is to say, a first end (for example, a drain) of the transistor $Q_3$ serves as the first end (for example, the cathode) of the diode $D_1$, a second end (for example, a source) of the transistor $Q_3$ serves as the second end (for example, the anode) of the diode $D_1$, and a control end (for example, a gate) of the transistor $Q_3$ is coupled to the drain of the transistor $Q_3$. Moreover, a first end (for example, a drain) of the transistor $Q_4$ serves as the first end (for example, the cathode) of the diode $D_2$, a second end (for example, a source) of the transistor $Q_4$ serves as the second end (anode) of the diode $D_2$, and a control end (for example, a gate) of the transistor $Q_4$ is coupled to the drain of the transistor $Q_4$.

Therefore, those of ordinary skills in the art can modify the first diode unit 311, the second diode unit 313, the first diode unit 411, and the second diode unit 413 in FIG. 9 and FIG. 11-FIG. 14 correspondingly based on the illustration in FIG. 15A or FIG. 15B.

In view of the above, taking the parasitic capacitor of the third transistor and the second resistor as a detection scheme, when it is detected that an ESD occurs to a first rail, the feedback scheme formed by the first resistor, the second resistor, the first transistor, and the second transistor is triggered to turn on the third transistor which serves as the clamp device, so as to discharge the ESD current from the first rail to a second rail, thus avoiding the damage to the core circuit by the ESD current. Meanwhile, such a feedback scheme has a capability of resisting being triggered wrongly when under fast power-on. The parasitic capacitor of the fourth transistor and the first resistor can also serve as a detection scheme, and can accelerate the discharging of the ESD current. When the ESD clamp circuit is suffering from noise interference, the latch-on phenomenon can be avoided through the first diode unit and the second diode unit. Moreover, the ESD clamp circuit in this embodiment only needs a small number of devices to implement, thus reducing the area of circuit layout.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge (ESD) clamp circuit, comprising:
   a first resistor, having a first end coupled to a first rail;
   a second resistor, having a second end coupled to a second rail;
   a first transistor, wherein a control end of the first transistor is coupled to a first end of the second resistor, and a second end of the first transistor is coupled to the second rail;
   a first diode unit, having two ends coupled to a second end of the first resistor and a first end of the first transistor respectively;
   a second transistor, wherein a control end of the second transistor is coupled to the second end of the first resistor, a first end of the second transistor is coupled to the first rail, and a second end of the second transistor is coupled to the first end of the second resistor; and
   a third transistor, wherein a control end of the third transistor is coupled to the first end of the second resistor, a first end of the third transistor is coupled to the first rail, and a second end of the third transistor is coupled to the second rail.

2. The ESD clamp circuit according to claim 1, wherein the first transistor is an N-channel metal oxide semiconductor (NMOS) transistor, the second transistor is a P-channel metal oxide semiconductor (PMOS) transistor, and the third transistor is an NMOS transistor.

3. The ESD clamp circuit according to claim 1, wherein the first transistor is a PMOS transistor, the second transistor is an NMOS transistor, and the third transistor is a PMOS transistor.

4. The ESD clamp circuit according to claim 1, wherein the third transistor is a big field effect transistor (BIGFET).

5. The ESD clamp circuit according to claim 1, further comprising:
   a fourth transistor, wherein a control end of the fourth transistor is coupled to the second end of the first resistor, a first end of the fourth transistor is coupled to the first rail, and a second end of the fourth transistor is coupled to the second rail.

6. The ESD clamp circuit according to claim 5, wherein the first transistor is an NMOS transistor, the second transistor is a PMOS transistor, the third transistor is an NMOS transistor, and the fourth transistor is a PMOS transistor.

7. The ESD clamp circuit according to claim 5, wherein the third transistor and the fourth transistor are BIGFETs.

8. The ESD clamp circuit according to claim 5, further comprising:
   a second diode unit, coupled between the second end of the second transistor and the first end of the second resistor.

9. The ESD clamp circuit according to claim 8, wherein the second diode unit comprises a second diode string formed by a plurality of diodes connected in series, and two ends of the second diode string are coupled to the second end of the second transistor and the first end of the second resistor respectively.

10. The ESD clamp circuit according to claim 9, wherein the diodes are implemented by transistors.

11. The ESD clamp circuit according to claim 1, wherein the first diode unit comprises a first diode string formed by a plurality of diodes connected in series, and two ends of the first diode string are coupled to the first end of the first transistor and the second end of the first resistor respectively.

12. The ESD clamp circuit according to claim 11, wherein the diodes are implemented by transistors.

13. The ESD clamp circuit according to claim 1, further comprising:
   a second diode unit, coupled between the second end of the second transistor and the first end of the second resistor.

14. The ESD clamp circuit according to claim 13, wherein the second diode unit comprises a second diode string formed by a plurality of diodes connected in series, and two ends of the second diode string are coupled to the second end of the second transistor and the first end of the second resistor respectively.

15. The ESD clamp circuit according to claim 14, wherein the diodes are implemented by transistors.

16. The ESD clamp circuit according to claim 1, wherein the first rail and the second rail are power rails.

17. An electrostatic discharge (ESD) clamp circuit, comprising:
- a first resistor, having a first end coupled to a first rail;
- a second resistor, having a second end coupled to a second rail;
- a first transistor, wherein a control end of the first transistor is coupled to a first end of the second resistor, a first end of the first transistor is coupled to a second end of the first resistor, and a second end of the first transistor is coupled to the second rail;
- a second transistor, wherein a control end of the second transistor is coupled to the second end of the first resistor, and a first end of the second transistor is coupled to the first rail; and
- a second diode unit, having two ends coupled to the first end of the second resistor and a second end of the second transistor respectively;
- a third transistor, wherein a control end of the third transistor is coupled to the first end of the second resistor, a first end of the third transistor is coupled to the first rail, and a second end of the third transistor is coupled to the second rail.

18. The ESD clamp circuit according to claim 17, wherein the first transistor is an N-channel metal oxide semiconductor (NMOS) transistor, the second transistor is a P-channel metal oxide semiconductor (PMOS) transistor, and the third transistor is an NMOS transistor.

19. The ESD clamp circuit according to claim 17, wherein the first transistor is a PMOS transistor, the second transistor is an NMOS transistor, and the third transistor is a PMOS transistor.

20. The ESD clamp circuit according to claim 17, wherein the third transistor is a big field effect transistor (BIGFET).

21. The ESD clamp circuit according to claim 17, further comprising:
- a fourth transistor, wherein a control end of the fourth transistor is coupled to the second end of the first resistor, a first end of the fourth transistor is coupled to the first rail, and a second end of the fourth transistor is coupled to the second rail.

22. The ESD clamp circuit according to claim 21, wherein the first transistor is an NMOS transistor, the second transistor is a PMOS transistor, the third transistor is an NMOS transistor, and the fourth transistor is a PMOS transistor.

23. The ESD clamp circuit according to claim 21, wherein the third transistor and the fourth transistor are BIGFETs.

24. The ESD clamp circuit according to claim 21, further comprising:
- a first diode unit, having two ends coupled to the second end of the first resistor and the first end of the first transistor respectively.

25. The ESD clamp circuit according to claim 24, wherein the first diode unit comprises a first diode string formed by a plurality of diodes connected in series, and two ends of the first diode string are coupled to the first end of the first transistor and the second end of the first resistor respectively.

26. The ESD clamp circuit according to claim 25, wherein the diodes are implemented by transistors.

27. The ESD clamp circuit according to claim 17, further comprising:
- a first diode unit, coupled between the second end of the first resistor and the first end of the first transistor.

28. The ESD clamp circuit according to claim 27, wherein the first diode unit comprises a first diode string formed by a plurality of diodes connected in series, and two ends of the first diode string are coupled to the first end of the first transistor and the second end of the first resistor respectively.

29. The ESD clamp circuit according to claim 28, wherein the diodes are implemented by transistors.

30. The ESD clamp circuit according to claim 17, wherein the second diode unit comprises a second diode string formed by a plurality of diodes connected in series, and two ends of the second diode string are coupled to the second end of the second transistor and the first end of the second resistor respectively.

31. The ESD clamp circuit according to claim 30, wherein the diodes are implemented by transistors.

32. The ESD clamp circuit according to claim 17, wherein the first rail and the second rail are power rails.

\* \* \* \* \*